United States Patent
Callaway, Jr.

(10) Patent No.: US 6,215,360 B1
(45) Date of Patent: Apr. 10, 2001

(54) SEMICONDUCTOR CHIP FOR RF TRANSCEIVER AND POWER OUTPUT CIRCUIT THEREFOR

(75) Inventor: Edgar Herbert Callaway, Jr., Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/027,783

(22) Filed: Feb. 23, 1998

(51) Int. Cl.$^7$ ................................. H03F 3/04; H03F 3/68
(52) U.S. Cl. ...................... 330/310; 330/286; 330/277; 330/302; 330/307; 257/347; 257/352; 455/73
(58) Field of Search ..................... 330/286, 295, 330/277, 250, 310, 302, 307; 252/347, 350, 352, 531, 919; 455/73

(56) References Cited

U.S. PATENT DOCUMENTS

| | | | |
|---|---|---|---|
| 4,418,470 | * 12/1983 | Naster et al. | 257/352 |
| 5,021,743 | * 6/1991 | Chu et al. | 330/286 |
| 5,663,570 | * 9/1997 | Reedy et al. | 257/350 |
| 5,939,755 | * 8/1999 | Takeuchi et al. | 257/350 |

OTHER PUBLICATIONS

Tan, Y., Kumar, M., Sin, J., Shi, L., and Lau, J., "A 900–MHz Fully Integrated SOI Power Amplifier for Single–Chip Wireless Transceiver Applications," IEEE Journal of Solid–State Circuits, vol. 35, No. 10, Oct. 2000.

*Power Amplifiers on Thin–FilmSilicon–on–Insulator (TFSOI) Technology* by D. Ngo, W.M. Huang, J.M. Ford and Dan Spooner of Motorola Semiconductor Products Sector, Mesa, AZ, 1999 IEEE Internation SOI Conference, Oct. 1999, pp. 133–134.

Thomas T. Y. Wong, Fundamentals of Distributed Amplification, Boston: Artech House 1993; ISBN 0–89006–615–9.

Huang, W. M., Ngo, D., Babcock, J., Shin, H.C., Welch, P., Rancanelli, M., Foerstner, J., Ford, J., and Cheng S., TFSOI Complementary BiCMOS Technology for Low Power RF mixed–Mode Applications, IEEE 1996, Advanced Custom Technologies, Motorola, Inc. 0–7803–3177–6.

Saul, P.H., The Bonded Wafer Silicon on Insulator Approach to High Performance Low Power Integrated Circuits, the Institution of Electricla Engineers, 1995, London UK.

Stanley, T. D., the State–of–the–Art in SOI Technology, Defense Nuclear Agency, Virginia USA 1999 IEEE 0018–9499/88/1200–1346301.00.

Hughes, W. and Brucker G. J., Radiation Hardened MOS Technology, RCA Laboratories, NJ, Jul. 1979, Solid State Technology.

Hitachi Releases Single–Chip High–Frequency Signal Processing IC for Digital Cellular Standards GSM–900, DCS–1800/1900 Dual–Bank Use, Hitachi 1999 http://global hitachi.com/New/cnews/E1999/991116B.html.

"MESFET Distributed Amplifier Design Guideline", James B. Beyer, S.N. Prasad, Robert C. Becker, James E. Nordman and Gert K. Hohenwarter IEEE Transaction on Microwave Theory and Techniques, bol. MTT–32, No. 3, Mar. 1984, pp. 268–275.*

"Distributed amplifiers: Their time comes again", part 1, Microwaves & RF, Nov. 1984 pp. 119–127*

"Distributed amplifiers: Their time comes again", part 2, Microwaves and RF, Dec. 1984, pp. 126–131 & 153.*

"CMOS–Microwave Wideband Amplifiers and Mixers on SIMOX–Substrates", European solid–state circuits conference, Lille, France, Sep. 1995, pp. 302–305.*

"Silicon MOSFET distributed amplifier", Electronics Letters, Jun. 6, 1996, vol. 32 No. 12.*

* cited by examiner

Primary Examiner—Michael B Shingleton

(57) ABSTRACT

A power output circuit is constructed as a distributed amplifier (21) with sufficient stages to make it practical for use as part of a transmitter, while also being integratable as part of a single-chip RF transceiver (72).

27 Claims, 4 Drawing Sheets

SEMICONDUCTOR CHIP FOR RF TRANSCEIVER AND POWER OUTPUT CIRCUIT THEREFOR

Field of the Invention

This invention is directed generally to the field of electronic amplifiers, and particularly to amplifiers for use in power output stages of RF (Radio Frequency) communication products.

BACKGROUND OF THE INVENTION

In products such as RF transceivers, it is desirable to integrate as much circuitry as possible on a single, semiconductor chip. This has not been practical for most such products because of the power requirements associated with the transmitter's power output stage. Consequently, the power output stage has usually been constructed as an off-chip, discrete amplifier.

Certain semiconductor products and processes have been thought to be nearly ideal for integrating RF communication systems on silicon. One such process is referred to as SOI (Silicon-on-Insulator). It offers high circuit density, low power operation at low supply voltage, intrinsically high substrate isolation, and other properties that make it very suitable for digital and small-signal RF applications. However, SOI has not been considered as practical for integrating the RF power output stages used by two-way communication products. The problem is heat transfer.

In the typical SOI process, silicon dioxide is used as the insulator over a silicon substrate. The thermal conductivity of the silicon dioxide is much lower than that of silicon. In addition, due to second-order effects, the thermal conductivity of the silicon itself, when placed in thin layers, is less than the its bulk value by as much as 35 percent. These effects cause severe self-heating in large SOI power devices, and limit the amount of power one may generate on-chip. This forces the power amplifier to be off chip, with all of the associated cost and size penalties of discrete components.

Another technology that has been used successfully in small signal applications is referred to as CMOS (Complimentary Metal Oxide Semiconductor). The drawbacks of CMOS for RF applications include its inability to provide good inductors, and its large parasitic substrate capacitance. Consequently, CMOS has not usually been considered a good technology for RF applications.

It has been reported that CMOS may be combined with SOI in certain RF applications involving relatively low power and small signals. See, for example "CMOS-Microwave Wide band Amplifiers and Mixers on SIMOX-Substrates" by Eggert et al., European Solid State Circuits Conference, September 1995, pp 302–305. However, power output stages have not been practical to build using SOI, CMOS or a combination of SOI and CMOS technologies. Consequently, the power output stages of RF products continue to be constructed with discrete components, resulting in RF products that are larger and more expensive than is desired.

DESCRIPTION OF THE PREFERRED EMBODIMENT

Although the SOI semiconductor process has been considered an unlikely candidate for power applications, it is the preferred process used to implement this invention. I have found that chips made with the SOI process can be adapted to handle the power levels required of many transmitters, such as the transmitters used in cellular telephones, two-way pagers, and the like.

The adaptation that is required is not in the SOI process itself, but in the design of the power output circuit (sometimes referred to herein as a power amplifier). The power output circuit used has N (an integer that is discussed later) stages of transistors that are coupled in circuit with passive elements to form a distributed amplifier. The input to the distributed amplifier is an RF signal to be amplified, and the output is an amplified RF signal at a power level of $P_d$ watts, where $P_d$ is the desired output power of the transmitter. If each transistor stage of the distributed amplifier is capable of providing an output power of Q watts, then the number of stages N is set equal to at least $P_d/Q$. This approach spreads the power requirements over N stages, making it possible to use the SOI process; and the distributed amplifier sums the power generated by all the stages to provide an output signal at the desired power level, accomplishing this in an efficient, integratable manner superior to other power combining methods. Not only does this approach provide an RF power output circuit that can be integrated, but it can be used to provide a single semiconductor chip that provides all the functions of an RF transceiver.

Figure 1:
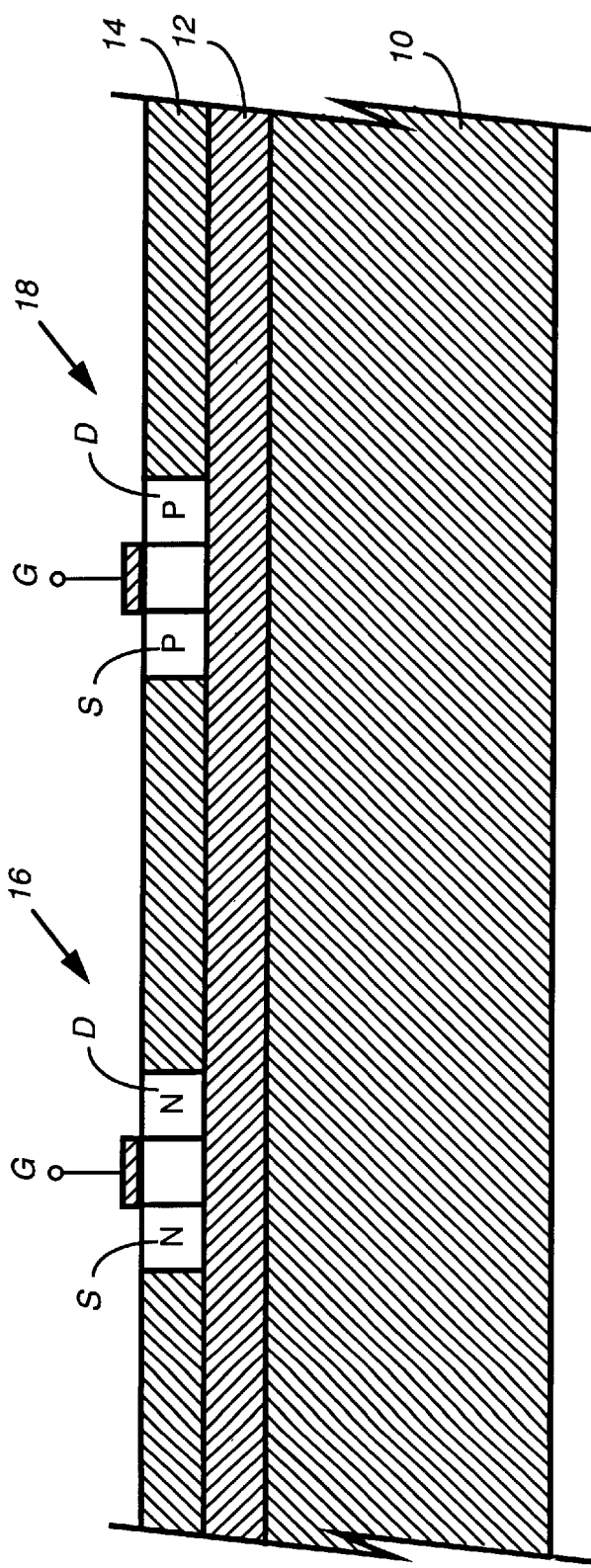
FIG. 1 illustrates a semiconductor material of the type preferably used in the fabrication of a power output stage according to the invention.

The preferred semiconductor technology employed by the invention is shown in FIG. 1. The illustrated semiconductor material includes a silicon substrate 10 covered by an insulating layer 12 of silicon dioxide. Above the layer 12 is another layer 14 of silicon. It is in this layer 14 that transistors are formed for use in the distributed amplifier.

Two types of MOS (metal oxide semiconductor) transistors are shown, an NMOS transistor 16 and a PMOS transistor 18. The NMOS transistor is used in the distributed amplifier that is described later. Using conventional semiconductor processing, the transistor 16 is formed with an N region acting as a source (S), another N region acting as a drain (D), and a gate G. The transistor 18 is formed by a pair of P regions acting as source and drain, and a gate G.

Figure 2:
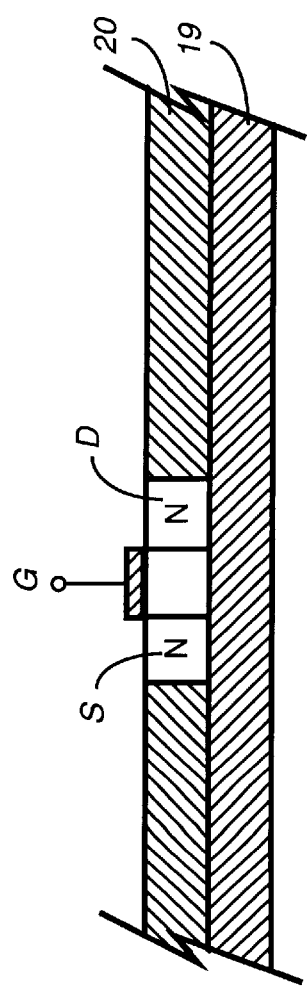
FIG. 2 illustrates another semiconductor material that may be used to fabricate a power output stage according to the invention.

Although the invention is preferably implemented using the SOI process, a power output circuit according to the invention may also be implemented using a SOS (Silicon on Sapphire) process, as shown in FIG. 2. In the SOS process, a sapphire substrate 19 is covered by a silicon layer 20. The transistor stages needed for coupling one transmission line to another transmission line are formed in the layer 20. One such transistor is shown, having a source (S), a drain (D) and a gate (G).

A distributed amplifier 21 that is integrally constructed with the semiconductor material of FIG. 1 is shown in FIG.

3. As used herein, the term "distributed amplifier" means an amplifier having an input transmission line, an output transmission line, and multiple transistor stages that couple the transmission lines together by the transconductance of the transistor stages.

The distributed amplifier 21 has an input transmission line 22 that includes inductors 24 at the beginning and end of the transmission line 22, and a series of inductors 26 connected between the inductors 24; the value of each inductor 24 is one-half the value of each inductor 26. The input transmission line is terminated by a resistance 28 of 50 ohms, with an RF bypass capacitor 30 coupled between the resistance 28 and ground.

An output transmission line 32 includes an inductor 34 at each end of the transmission line, and a series of inductances 36 connected between inductances 34; the value of inductors 34 is equal to the value of inductors 24, and the value of inductors 36 is equal to the value of inductors 26. A supply voltage for the distributed amplifier is provided by V+ which may be +1 volt. The V+ supply is coupled to the transmission line 32 by an RF choke 35. The termination for the output transmission line is provided by a 50 ohm resistance 37, with an RF bypass capacitor 31 coupled between the resistance 37 and ground.

The input transmission line 22 is coupled to the output transmission line 32 by the transconductance of N stages of transistors 38. The gate of each transistor is coupled to a junction between adjacent inductors in the input transmission line 22. The source of each transistor is grounded, with its drain coupled to a junction between adjacent inductors in the output transmission line 32.

The illustrated embodiment uses a single transistor 38 as a transistor stage, but other arrangements are also possible. For example, a single transistor stage may include two transistors coupled together as a cascode amplifier.

Bias for the transistors 38 is provided by a current source 39 coupled in series with the drain of a transistor 40. With the drain of transistor 40 coupled to its gate, and the gate coupled to the input transmission line 22 through an isolating resistance 41, equal bias currents are established in each of the transistors 38. That bias current, 750 microamps in this example, is substantially equal to the current supplied by the current source 39.

The principals behind the operation of a distributed amplifier are well documented in the literature. See British patent number 460,562, and an article entitled "MESFET Distributed Amplifier Design Guidelines", IEEE Transactions on Microwave Theory and Techniques, Vol. MTT-32, No. 3 by Beyer et al., both teachings of which are incorporated herein by reference. Suffice it to say that the gate and drain capacitances of the transistors 38 are absorbed into the inductors 24, 26, 34, and 36, thereby forming artificial transmission lines. When an input signal is applied to the amplifier's input terminal 42, the signal travels down the transmission line 22 to the terminating resistance 28 which absorbs the signal, thereby preventing any signal reflection. As the input signal travels down the input transmission line, each transistor 38 becomes excited by the traveling signal and transfers the signal to the output transmission line through its transconductance. The signals output by the transistors 38 are summed at an output terminal 44. Any signal that propagates in the opposite direction is absorbed by the resistance 37.

A characteristic of distributed amplifiers that is used to advantage by this invention is that the output power at terminal 44 is substantially equal to the sum of the individual power outputs of the transistors 38. Using this characteristic according to one aspect of the invention, we expand the number of transistor stages substantially beyond the number of stages that have been used for small signal amplifiers. Thus, if each transistor stage 38 is capable of providing an output power of Q watts, and if the desired power output at terminal 44 is $P_d$ watts, then the number N of transistor stages is selected to be equal to at least $P_d/Q$. For example, the distributed amplifier shown in FIG. 3 was designed as the power output stage of a portable paging transmitter that is required to develop an output power $P_d$ of 320 mw (milliwatts). Assuming that each transistor 38 is capable of providing 20 mw, then 16 stages are required.

There are, however, other considerations to take into account when determining the value of N. The semiconductor area that is available for the distributed amplifier may be large enough to allow an increase in the value of N, so that N exceeds the minimum value needed to provide the desired output power. By increasing the number of stages, the power associated with each stage can be reduced. If the semiconductor material permits heat to be removed relatively fast, then each stage may be operated at its maximum permissible power, and the number of stages may be reduced. In any case, the stages should be physically separated from each other by a distance which permits the chip to dissipate heat without damage.

Another factor to be considered is the amplifier's frequency of operation. As the number of stages increases, the output resistances of the transistors begin to reduce the amplifier's gain. I have found that, for an RF power output circuit built as a distributed amplifier using a 0.5 micron SOI process, the number of stages N is preferably between 16 and 32. Sixteen stages provides a power output that is useful for many RF power applications, and spreads the power out among the individual stages so that it becomes practical to integrate the distributed amplifier on a chip with other components of an RF transceiver, thus making possible a "one-chip" transceiver. On the other hand, increasing the number of stages beyond 32 brings into play the transistor's output resistances, as discussed above. For these reasons, it is preferred to select the number of stages, N, from the range 16 –32, inclusive.

Figure 3:
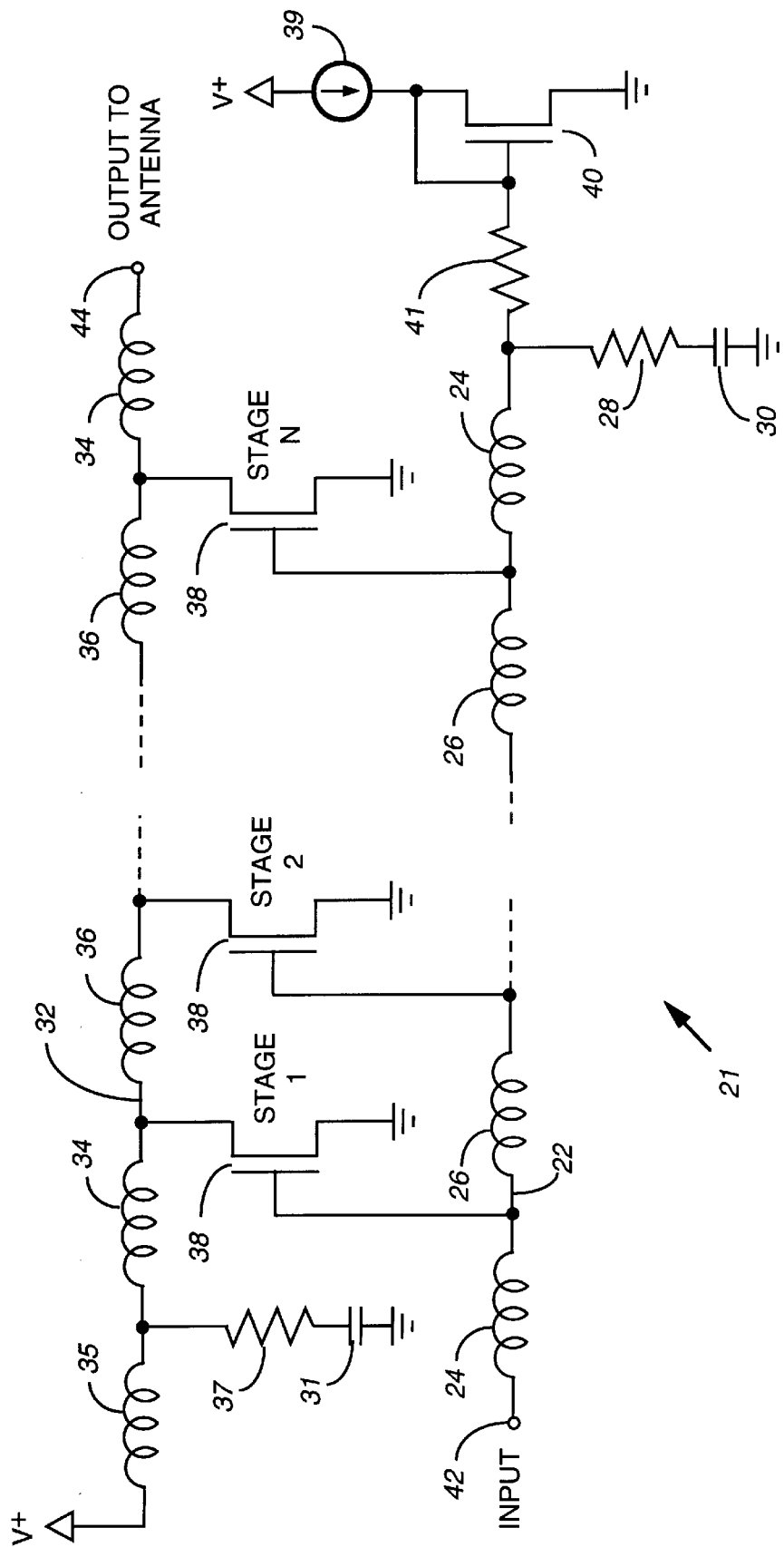
FIG. 3 is a circuit diagram of a power output stage according to a preferred aspect of the invention.

A 16 stage distributed amplifier, as shown in FIG. 3, was built using a 0.5 $\mu$(micron) SOI process. The transistors were 25 $\mu$×0.5 $\mu$×20 fingers.

The inductors may be formed conventionally, using the top metal layer of the SOI process to form metal strips. In the constructed amplifier, which was designed for operation between 50 and 3000 MHz, the inductors 26 and 36 (FIG. 3) had a design value of 2 nanohenries, while inductors 24 and 34 had a design value of 1 nanohenry.

The gain of the constructed amplifier was 16 db at 12 ma drain current (750 $\mu$a per transistor) and a 1 volt $V_{dd}$. The amplifier was designed to be wafer probed, so as to reduce the effects of packaging on its performance.

Figure 4:
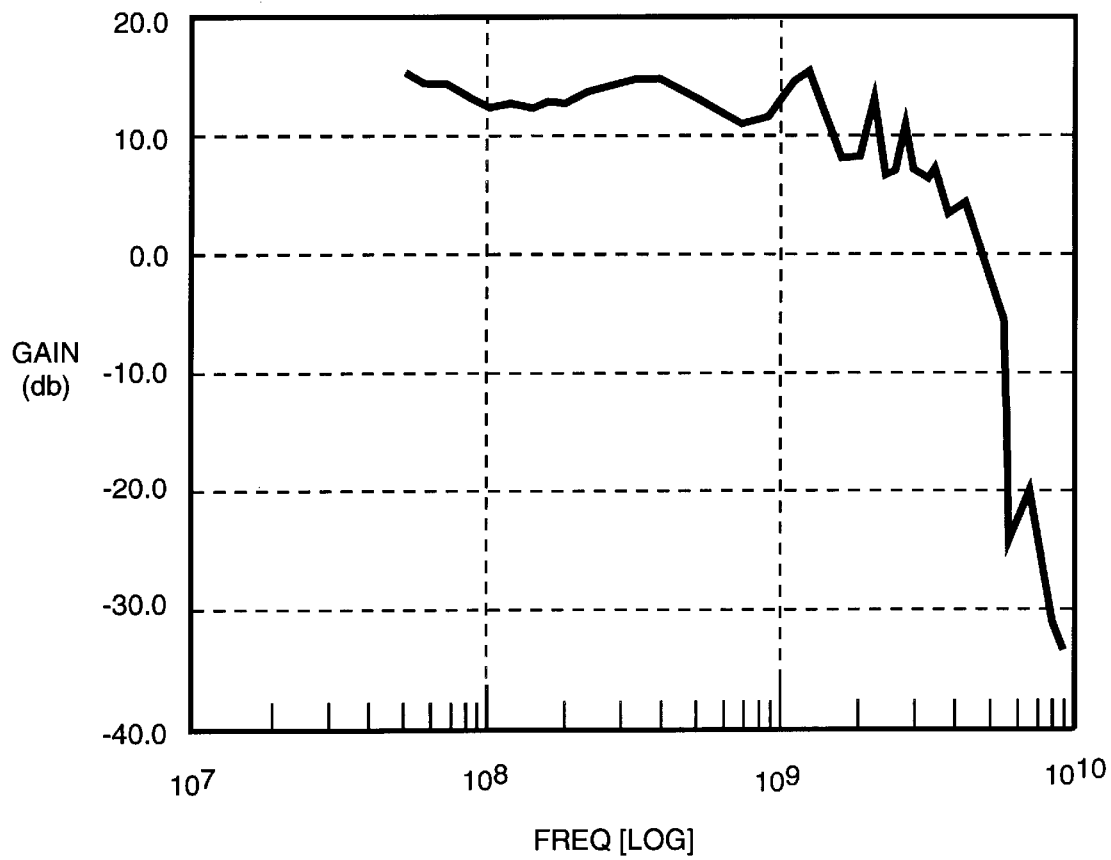
FIG. 4 is a graph illustrating the gain of the power output stage of FIG. 3.

FIG. 4 shows the performance of the constructed amplifier. Note the very useful gain out to about 3 gigahertz.

Figure 5:
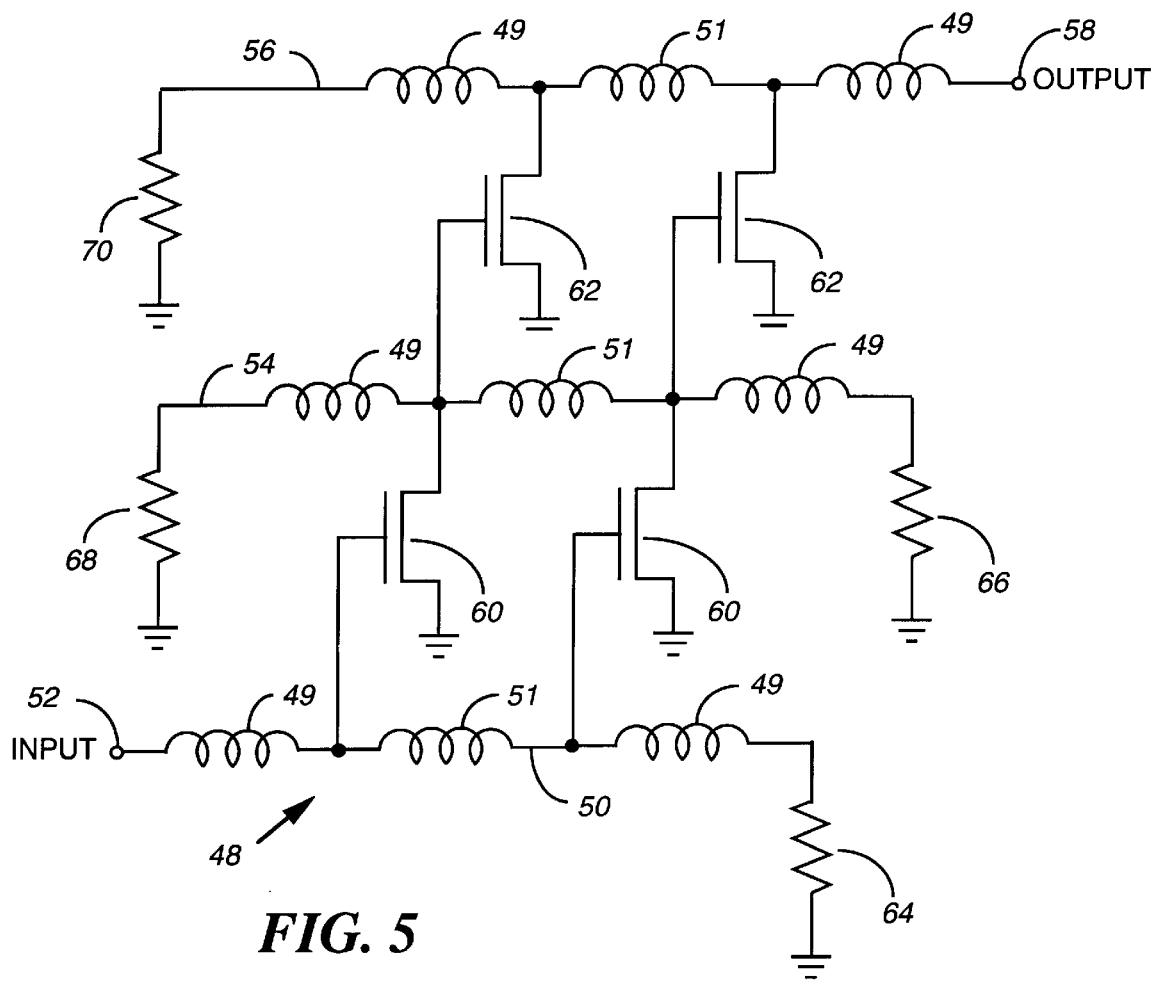
FIG. 5 illustrates an alternate power output stage according to the invention.

Referring to FIG. 5, an alternate embodiment of a power output circuit 48 according to the invention is shown. Certain obvious details, such as Vdd connections, have been omitted from FIG. 4.

This power output circuit has three transmission lines: a first or input transmission line 50, having inductors 49 and 51 and an input 52 for receiving a signal to be amplified; a second transmission line 54 comprising inductors 49 and 51; and a third or output transmission line 56 having inductors 49 and 51 and an output 58 at which the output power is provided. All of the inductors 49 may be of equal value; and all of the inductors 51 may be of equal value, and preferably twice the value of inductors 49.

Stages of transistors 60 are coupled as shown between the first transmission line 50 and the second transmission line 54. Stages of transistors 62 are coupled between the second transmission line 54 and the third transmission line 56. Resistances 64, 66, 68 and 70 provide proper terminations for the transmission lines to which they are coupled.

In operation, the power output circuit 48 acts as a distributed amplifier, as discussed previously in connection with FIG. 3. The transconductances of transistor stages 60 couple the first transmission line 50 to the second transmission line 54, and the transconductances of transistor stages 62 couple the second transmission line 54 to the third transmission line 56. The power developed by each of the transistor stages 60, 62 is summed at the output 58.

The power output circuit of FIG. 5 may be expanded to include additional transmission lines situated between the input transmission line 50 and the output transmission line 56. For example, an additional transmission line may be added between the second transmission line 54 and the output transmission line 56, with transistor stages coupling the additional transmission line to adjacent transmission lines, in the same manner as shown in FIG. 5.

The power output stages shown in FIGS. 3 and 5 may also be implemented using the SOS process illustrated in FIG. 2.

Figure 6:
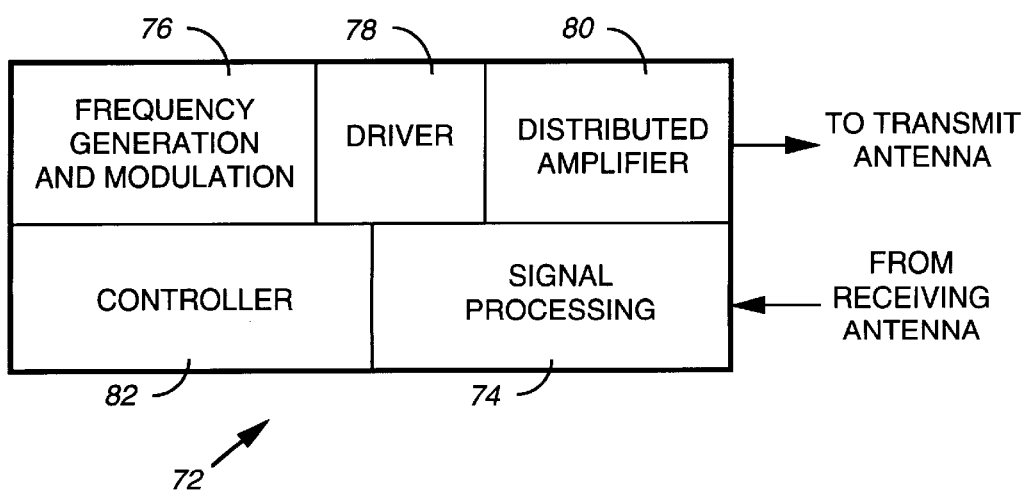
FIG. 6 is a block diagram of a semiconductor chip incorporating the power output stage of FIG. 3 and other components of an RF transceiver.

The primary reason for providing an intergratable power output circuit is to permit fabricating a "single chip" RF transceiver. One such "single chip" device is shown in FIG. 6. A single IC chip 72 includes conventional signal processing block 74 for amplifying, filtering and demodulating incoming signals, and a conventional frequency generation and modulation block 76 that includes the required oscillator (s), phase locked loop, and signal modulation circuitry. The modulated signal output from the block 76 is applied to a conventional driver 78 which provides an amplified signal to a distributed amplifier 80 acting as a power output stage for driving a transmitting antenna (not shown). A controller 82 that controls various functions of the chip 72 in a conventional manner may be a microprocessor, a state machine, or other form of logic circuit.

The distributed amplifier 80 may be of the type shown in FIGS. 3 or 4, although the FIG. 3 embodiment is preferred, using 16 transistor stages and the component values described earlier for wideband operations up to about 1 gigahertz. The chip 72 provides a power output of about 320 mw, which is suitable for many portable transceivers.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. An RF power output circuit for developing a desired RF output power Pd, comprising:

a semiconductor material comprising a substrate covered by an insulating layer, and N topologically equivalent stages of transistors coupled in circuit with passive elements to form a distributed amplifier having an input for receiving an RF signal to be amplified, and having an output, each stage being capable of providing an output power of Q watts, wherein the distributed amplifier is integrally constructed with the semiconductor material, and wherein the number of stages N of transistors is equal to at least Pd/Q, and wherein each of the N stages is physically separated from the other of the N stages by a distance permitting the RF power output circuit to dissipate heat without damage to the RF power output circuit.

2. An RF power output circuit as set forth in claim 1 wherein the distributed amplifier includes:

a first transmission line having an input for receiving a signal to be amplified;

a second transmission line having an output at which the output power is provided, and wherein the N stages of transistors are coupled between the first transmission line and the second transmission line.

3. An RF power output circuit as set forth in claim 1 wherein the distributed amplifier includes:

an input transmission line having an input for receiving a signal to be amplified;

an output transmission line having an output at which the output power is provided; and at least one additional transmission line situated between the input transmission line and the output transmission line, and wherein stages of transistors are coupled between the input transmission line and the at least one additional transmission line, and between the at least one additional transmission line and the output transmission line.

4. An RF power output circuit for developing a desired RF output power Pd, comprising:

a semiconductor material comprising a sapphire substrate covered by a layer of silicon; and N topologically equivalent stages of transistors coupled in circuit with passive elements to form a distributed amplifier having an input for receiving an RF signal to be amplified, and having an output, each stage being capable of providing an output power of Q watts, wherein the distributed amplifier is integrally constructed with the semiconductor material, and wherein the number of stages N of transistors is equal to at least Pd/Q, and wherein each of the N stages is physically separated from the others of the N stages by a distance permitting the RF power output circuit to dissipate heat without damage to the RF power output circuit.

5. A semiconductor chip for an RF transceiver, comprising:

a semiconductor material comprising a substrate covered by an insulating layer; and constructed integrally with the semiconductor material:

signal processing circuitry for receiving, amplifying and demodulating incoming RF signals;

a frequency generator for developing at least one signal at a reference frequency for use by the signal processing circuitry;

a power output circuit providing an output signal of a desired transmission power; and a controller for controlling the operation of the frequency generator, the signal processing circuitry and the power output circuit, wherein the power output circuit comprises multiple equivalent stages of transistors coupled in circuit with passive elements to form a distributed amplifier, and wherein each of the N stages is physically separated from the other of the N stages by a distance permitting the semiconductor chip to dissipate heat without damage to the semiconductor chip.

6. A semiconductor chip as set forth in claim 5 wherein the substrate is silicon and the insulating layer is silicon dioxide.

7. A semiconductor chip as set forth in claim 6 wherein the number of multiple stages of transistors is selected to be between 16 stages and 32 stages, inclusive.

8. A semiconductor chip as set forth in claim 5 wherein the distributed amplifier includes:
   a first transmission line having an input for receiving a signal to be amplified;
   a second transmission line having an output at which the output power is provided,
   and wherein the multiple stages of transistors are coupled between the first transmission line and the second transmission line.

9. A semiconductor chip as set forth in claim 5 wherein the substrate is silicon and the insulating layer is silicon dioxide.

10. A semiconductor chip as set forth in claim 5 wherein the distributed amplifier includes:
    a first transmission line having an input for receiving a signal to be amplified;
    a second transmission line; and
    a third transmission line having an output at which the output power is provided,
    and wherein the multiple stages of transistors are coupled between the first transmission line and the second transmission line, and between the second transmission line and the third transmission line.

11. A semiconductor chip for an RF transceiver, comprising:
    a semiconductor material comprising a silicon substrate covered by a layer of silicon dioxide; and
    constructed integrally with the semiconductor material:
      signal processing circuitry for receiving, amplifying and demodulating incoming RF signals;
      a frequency generator for developing at least one signal at a reference frequency for use by the signal processing circuitry;
      a power output circuit providing an output signal of a desired transmission power; and
      a controller for controlling the operation of the frequency generator, the signal processing circuitry and the power output circuit,
    wherein the power output circuit comprises an input transmission line, an output transmission line and N equivalent stages of transistors coupled between the input transmission line and the output transmission line, and wherein N is an integer whose value is selected from the range 16–32, depending on the desired level of transmission power, and wherein each of the N stages is physically separated from the other of the N stages by a distance permitting the semiconductor chip to dissipate heat without damage to the semiconductor chip.

12. The RF power output circuit according to claim 1, wherein each stage comprises an output transistor that provides approximately 20 milliwatts of power.

13. The RF power output circuit according to claim 1, wherein each stage comprises an output transistor that comprises gate fingers having a total width of approximately 500 microns.

14. The RF power output circuit according to claim 1, wherein each stage comprises an output transistor that provides approximately 20 milliwatts of power.

15. The RF power output circuit according to claim 1, wherein each stage comprises an output transistor that comprises gate fingers having a total width of approximately 500 microns.

16. The semiconductor chip according to claim 5, wherein each stage comprises an output transistor that provides approximately 20 milliwatts of power.

17. The semiconductor chip according to claim 5, wherein each stage comprises an output transistor that comprises gate fingers having a total width of approximately 500 microns.

18. The semiconductor chip according to claim 11, wherein each stage comprises an output transistor that provides approximately 20 milliwatts of power.

19. The semiconductor chip according to claim 11, wherein each stage comprises an output transistor that comprises gate fingers having a total width of approximately 500 microns.

20. The semiconductor chip according to claim 19, wherein the gate fingers comprise approximately 20 fingers, each being 25 microns wide.

21. A semiconductor chip for an RF transceiver, comprising:
    a semiconductor material comprising a substrate covered by an insulating layer; and constructed integrally with the semiconductor material:
      signal processing circuitry for receiving, amplifying and demodulating incoming RF signals;
      a frequency generator for developing at least one signal at a reference frequency for use by the signal processing circuitry;
      a power output circuit providing an output signal of a desired transmission power; and
      a controller for controlling the operation of the frequency generator, the signal processing circuitry and the power output circuit,
    wherein the power output circuit comprises N topologically equivalent stages of transistors coupled in circuit with passive elements to form a distributed amplifier, and wherein each of the N stages is physically separated from the other of the N stages by a distance permitting the semiconductor chip to dissipate heat without damage to the semiconductor chip.

22. A semiconductor chip as set forth in claim 21 wherein the substrate is silicon and the insulating layer is silicon dioxide.

23. A semiconductor chip as set forth in claim 22 wherein the number, N, of stages of transistors is selected to be between 16 and 32 inclusive.

24. A semiconductor chip as set forth in claim 21 wherein the distributed amplifier includes:
    a first transmission line having an input for receiving a signal to be amplified;
    a second transmission line having an output at which the output power is provided,
    and wherein the multiple stages of transistors are coupled between the first transmission line and the second transmission line.

25. A semiconductor chip as set forth in claim 21 wherein the substrate is silicon and the insulating layer is silicon dioxide.

26. A semiconductor chip as set forth in claim 21 wherein the distributed amplifier includes:
    a first transmission line having an input for receiving a signal to be amplified;
    a second transmission line; and
    a third transmission line having an output at which the output power is provided, and wherein the N stages of transistors are coupled between the first transmission line and the second transmission line, and between the second transmission line and the third transmission line.

27. A semiconductor chip for an RF transceiver, comprising:
   a semiconductor material comprising a silicon substrate covered by a layer of silicon dioxide; and
   constructed integrally with the semiconductor material:
      signal processing circuitry for receiving, amplifying and demodulating incoming RF signals;
      a frequency generator for developing at least one signal at a reference frequency for use by the signal processing circuitry;
      a power output circuit providing an output signal of a desire transmission power, and
      a controller for controlling the operation of the frequency generator, the signal processing circuitry and the power output circuit,
   wherein the power output circuit comprises an input transmission line, an output transmission line and N topologically equivalent stages of transistors coupled between the input transmission line and the output transmission line, and wherein N is an integer whose value is selected from the range 16–32, depending on the desired level of transmission power, and wherein each of the N stages is physically separated from the other of the N stages by a distance permitting the semiconductor chip to dissipate heat without damage to the semiconductor chip.

* * * * *